United States Patent
Pfauser

(10) Patent No.: US 6,219,266 B1
(45) Date of Patent: Apr. 17, 2001

(54) SELF-COMMUTATED POWER CONVERTER OF A VOLTAGE-IMPRESSING CONVERTER WITH N HIGH-POWER MODULES

(75) Inventor: Anton Pfauser, Pommersfelden (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/581,725

(22) PCT Filed: Dec. 4, 1998

(86) PCT No.: PCT/DE98/03570

§ 371 Date: Jun. 16, 2000

§ 102(e) Date: Jun. 16, 2000

(87) PCT Pub. No.: WO99/31791

PCT Pub. Date: Jun. 24, 1999

(30) Foreign Application Priority Data

Dec. 17, 1997 (DE) .............................................. 197 56 250

(51) Int. Cl.⁷ .............................. H02M 1/00; H05K 7/20
(52) U.S. Cl. ............................................. 363/141; 361/709
(58) Field of Search .................................... 363/141, 144; 361/675, 676, 704, 707, 709–712, 715, 728, 730

(56) References Cited

U.S. PATENT DOCUMENTS

| | | | |
|---|---|---|---|
| 4,296,455 | * 10/1981 | Leaycraft et al. | 361/383 |
| 4,315,300 | * 2/1982 | Parmerlee et al. | 361/382 |
| 4,682,268 | 7/1987 | Okano et al. | . |
| 5,218,516 | * 6/1993 | Collin et al. | 361/386 |
| 5,477,416 | 12/1995 | Schkrohowsky et al. | . |

FOREIGN PATENT DOCUMENTS

| | | |
|---|---|---|
| 43 16 999 | 11/1994 | (DE) . |
| 0 356 991 | 3/1990 | (EP) . |
| 0 658 934 | 6/1995 | (EP) . |

OTHER PUBLICATIONS

C. Tietze et al., "Transistorwechselrichter für Nahverkehrstriebfahrzeuge", Elektrische Bahnen, 1993, No. 11, pp. 341–347*** .

* cited by examiner

Primary Examiner—Matthew Nguyen
(74) Attorney, Agent, or Firm—BakerBotts L.L.P.

(57) ABSTRACT

A self-commutated power converter of a voltage-impressing converter having n high-power modules is described. These high-power modules are joined phasewise to a phase heat sink, respectively, in a detachable manner, and joined, one over another, to a partition in such a manner that their cooling fins protrude through openings of this partition into a ventilation space and each run horizontally, an air-discharge duct being arranged in the ventilation space, the air-discharge duct being designed in such a manner that the cooling air of the ventilation space flows laterally, in each case on both sides of the phase heat sinks, between the cooling fins into the air-discharge duct. Thus, a self-commutated power converter of a voltage-impressing converter is obtained whose size, weight and cost are considerably reduced compared to a power converter having a conventional design, and whose high-power modules are each fully utilized in terms of capacity.

11 Claims, 7 Drawing Sheets

SELF-COMMUTATED POWER CONVERTER OF A VOLTAGE-IMPRESSING CONVERTER WITH N HIGH-POWER MODULES

FIELD OF THE INVENTION

The present invention relates to a self-commutated power converter of a voltage-impressing converter having n high-power modules, in particular IGBT high-power modules.

BACKGROUND INFORMATION

On the market, voltage-source converters are available for three-phase drives up to several MW whose self-commutated power converter has a plurality of high-power modules. When working with these amounts of power, the self-commutated power converter has two inverters which are electrically connected in parallel. FIG. 1 shows an equivalent circuit diagram of a self-commutated power converter 2 of that kind. The two parallel-connected inverters 4 and 6 have IGBT high-power modules T1 through T6 and T1' through T6', respectively, as converter valves. IGBT high-power modules T1 through T6 of inverter 4 are mounted on a heat sink 8 (FIG. 2). In the same way, IGBT high-power modules T1' through T6' of inverter 6 are mounted on a heat sink 10 (FIG. 2).

In FIG. 2, these heat sinks 8 and 10 are illustrated with the appertaining IGBT high-power modules T1 through T6 and T1' through T6'. It can be deduced from this representation that IGBT high-power modules T1 through T6 and T1' through T6', respectively, are arranged one over another in the direction of flow of the cooling air. The heat sink used is shown in e.g., FIG. 4 of European Patent 0 658 934.

A disadvantage of this design of the power section of inverters 4 and 6 is that at least uppermost modules T1 and T1' receive a heated cooling air. The cooling air flowing in it heat sinks 8 and 10, respectively, heats up from IGBT module to IGBT module. Consequently, the cooling air can dissipate significantly less power loss at uppermost modules T1 and T1' than the cooling air at lowest modules T6 and T6'. To prevent inverters 4 and 6 from failure due to overheating of uppermost modules T1 and T1', respectively, self-commutated power converter 2 is technically rated by uppermost modules T1 and T1', respectively. Because of this, a power reduction of 20% can occur for self-commutated power converter 2. This means that, possibly, two IGBT high-power modules electrically connected in series must be provided per converter valve for a self-commutated heavy-duty power converter. In this manner, the illustrated problem would further intensify when working with an arrangement shown in FIG. 2, as a result of which one would have to expect a further increase in the power reduction. This means that the efficiency would further decline.

Moreover, these additional IGBT modules influence the size, the weight and the cost of the self-commutated power converter and, consequently, of the voltage-impressing converter, as well. Furthermore, when connecting at least two modules in series within such a converter arm, slightest differences in the switching times can already lead to unsymmetrical voltage sharing. Voltage differences of that kind can be prevented by an additional measure in the control. This additional outlay can be prevented by dividing the supply capacitor voltage into two parts by a center tap so that, in addition to the two potentials plus and minus, a potential zero results. By connecting the zero potential via in each case two additional midpoint diodes of each pair of arms, a "three-point power converter" results which is self-commutated.

In a paper entitled "Transistorwechselrichter für Nahverkehrstriebfahrzeuge [Transistor Inverters For Outer-Suburban Service Traction Vehicles]", published in German Periodical "eb - Elektrische Bahnen [Electric Railways]" No. 11, pages 341 through 347, such a three-point inverter is depicted as self-commutated power converter. A three-point inverter of that kind uses the same number of modules per inverter arm as a two-point inverter having two modules per converter valve, respectively, but has significant advantages, which are discussed in chapter 3.1 of this paper.

Commercial IGBT modules are supplied as encapsulated modules which contain the actual IGBT and an antiparallel free-wheeling diode. Because of the isolated design of the semiconductors inside the module, the IGBT modules of the three-point inverter can be mounted on a shared heat sink without further measures for electrical isolation. The cooling air brushes over the lower side of the heat sink and does not come into contact with the electric components on the upper side. In this arrangement, only three IGBT modules are arranged side by side along the direction of flow of the cooling air. This arrangement has the disadvantage that, in the case of a fault of an inverter phase, the outlay for replacing one or more modules is quite considerable.

SUMMARY

An object of the present invention is to provide a self-commutated power converter having n high-power modules which no longer has the above mentioned disadvantages.

In an example embodiment according to the present invention of the self-commutated power converter, the high-power modules of a phase are detachably joined to a phase heat sink. These phase heat sinks are linked to a partition of the power converter. The cooling fins of each phase heat sink protrude through the openings of the partition into a ventilation space. Because of this, in the case of faults in the converter arms (phases), these defective modules can be removed relatively easily. The partition also assures that the cooling air brushes only over the cooling fins of the phase heat sinks without coming into contact with the electric components (high degree of protection for the power electronics area).

Because the cooling fins of the individual phase heat sinks run horizontally in the ventilation space and provision is made for an air-discharge duct which is designed in such a manner that the cooling air of the ventilation space flows laterally, in each case on both sides of the phase heat sinks, between the cooling fins into the air-discharge duct, all IGBT high-power modules are cooled uniformly so that the capacity of the each IGBT module can be fully utilized.

Because of this design of the phase modules, up to twelve high-power modules can be mounted per phase heat sink as a function of a required load current, the high-power modules being cooled in such a manner that no power reduction must be accepted. In comparison with a conventional design of a self-commutated power converter having the same number of modules, the cooling improves considerably, savings being made in terms of size, weight, and consequently, the cost, as well.

By arranging the cooling fins of the individual phase heat sinks in a ventilation space and using an air-discharge duct, it is achieved that all high-power modules can be cooled nearly equally so that the IGBT high-power modules available on the market (1200 A/3300 V) can be fully utilized in terms of capacity.

DETAILED DESCRIPTION

Figure 1:
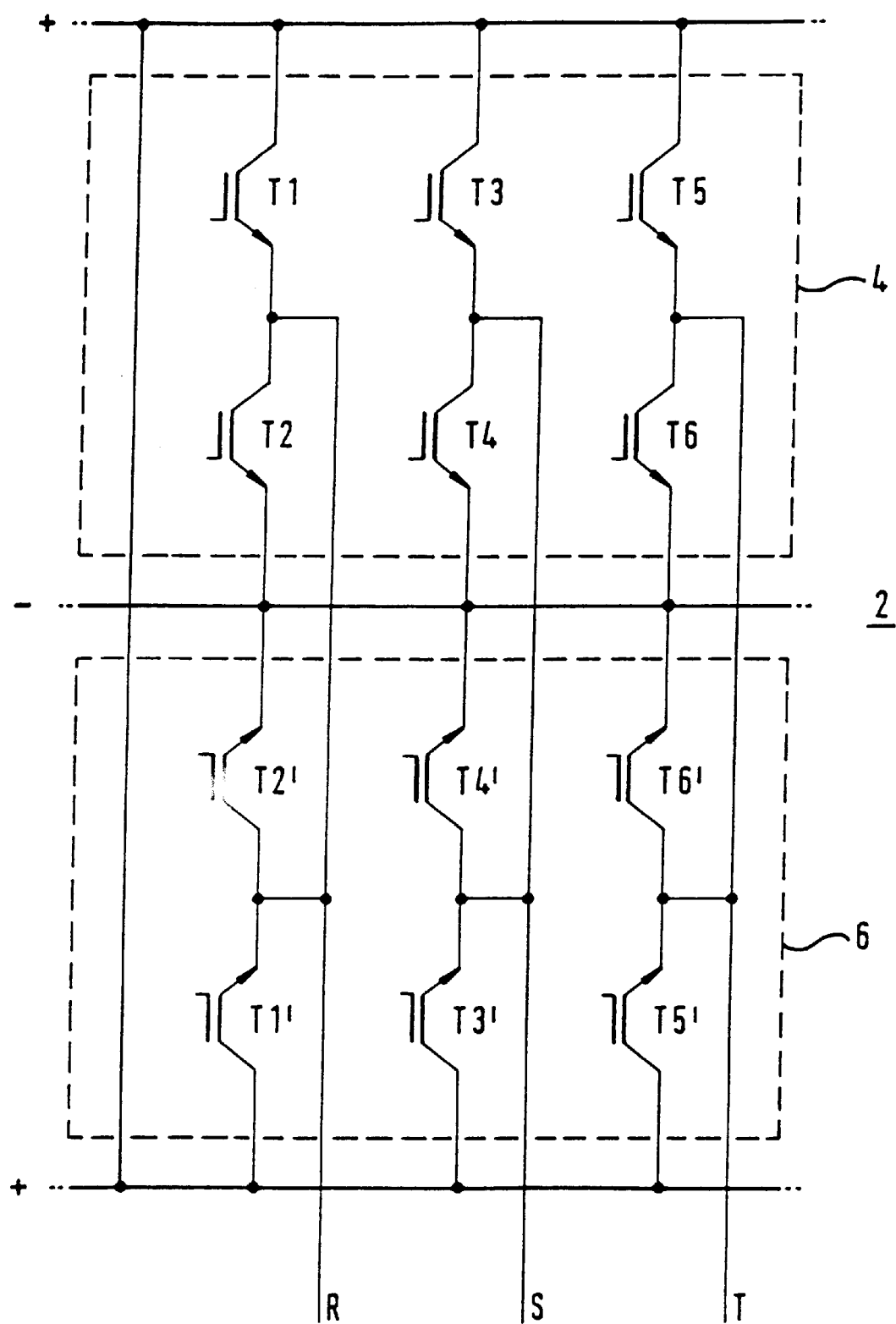
FIG. 1 shows an equivalent circuit diagram of a conventional self-commutated power converter.
Figure 2:
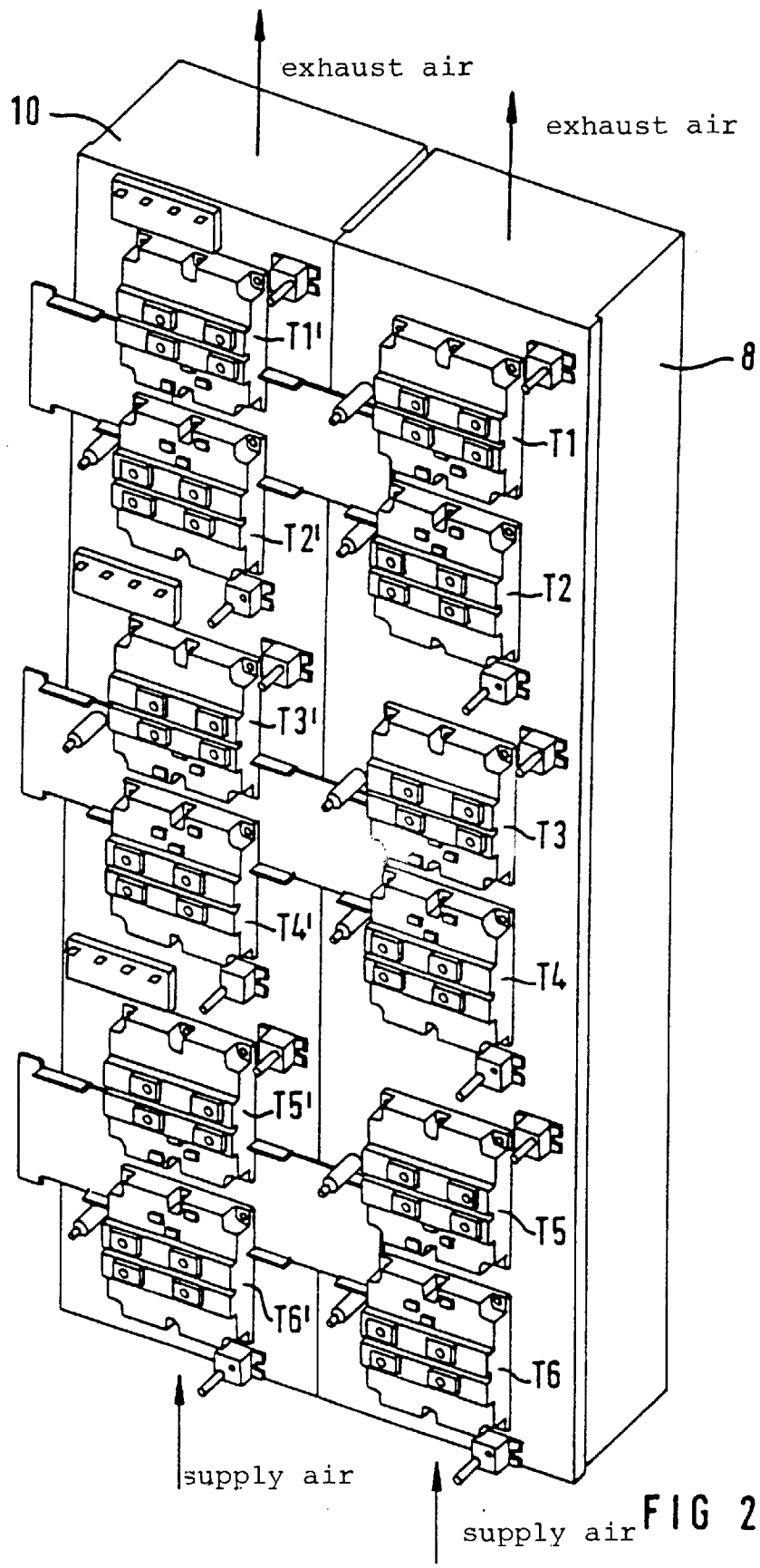
FIG. 2 shows an implementation of the conventional self-commutated power converter.
Figure 3:
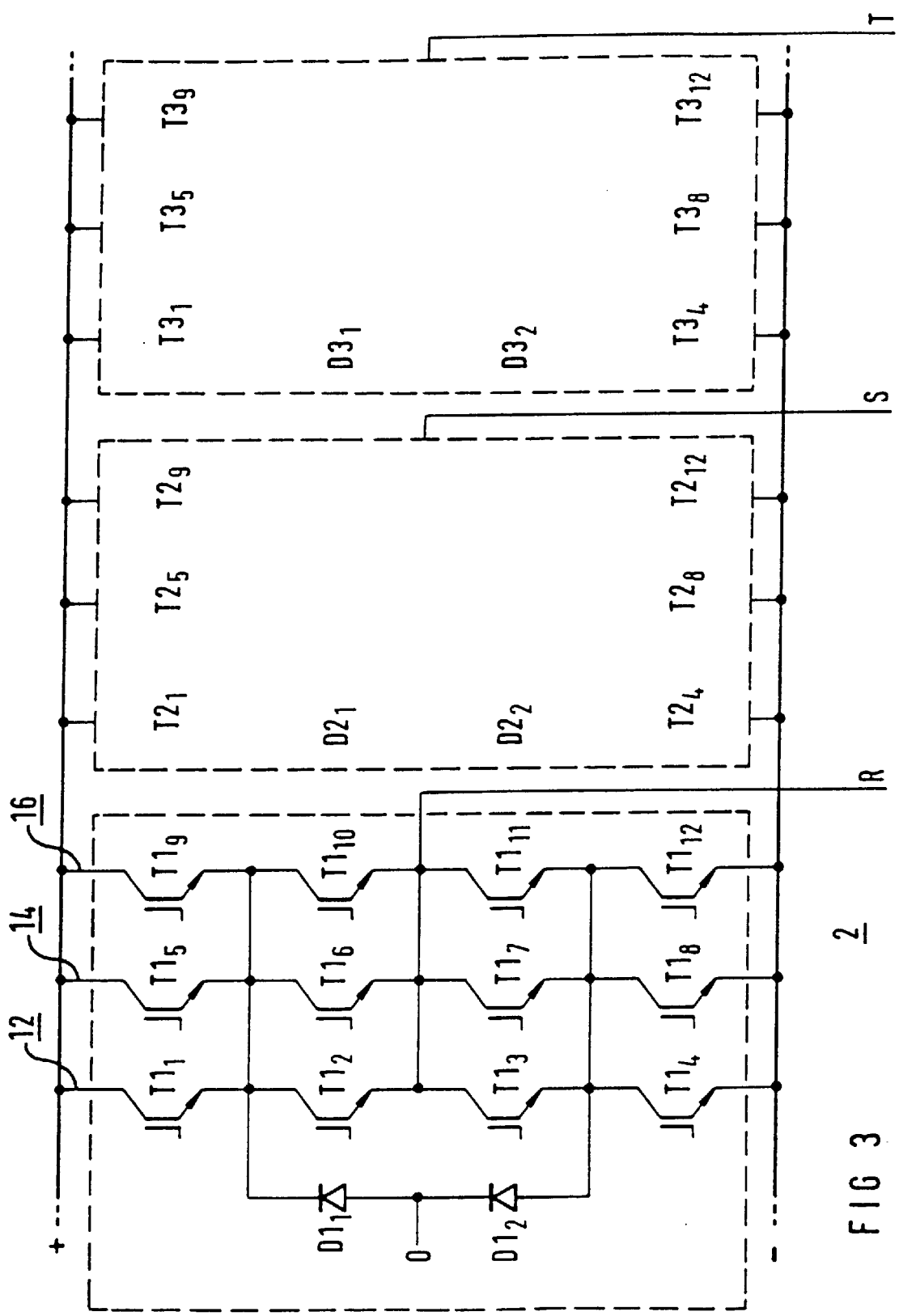
FIG. 3 shows an equivalent circuit diagram of a self-commutated heavy-duty power converter according to the present invention.

FIG. 3 shows an equivalent circuit diagram of a self-commutated heavy-duty power converter 2 of voltage-impressing converter, which is designed as a three-point power converter. This power converter 2 has three phases R, S, and T, which are designed identically. Dependent on a required load current, each phase R, S, and T has up to three three-point converter arms 12, 14, and 16, which are electrically connected in parallel. Provided as converter valves $T1_1 \ldots T1_4, T1_5 \ldots T1_8,$ and $T1_9 \ldots T1_{12}$, are in each case IGBT high-power modules. At present, IGBT modules are available for 1200 A and 3300 V. The stepwise implementation of this self-commutated heavy-duty power converter 2 is shown in greater detail in FIGS. 4 through 6.

Figure 4:
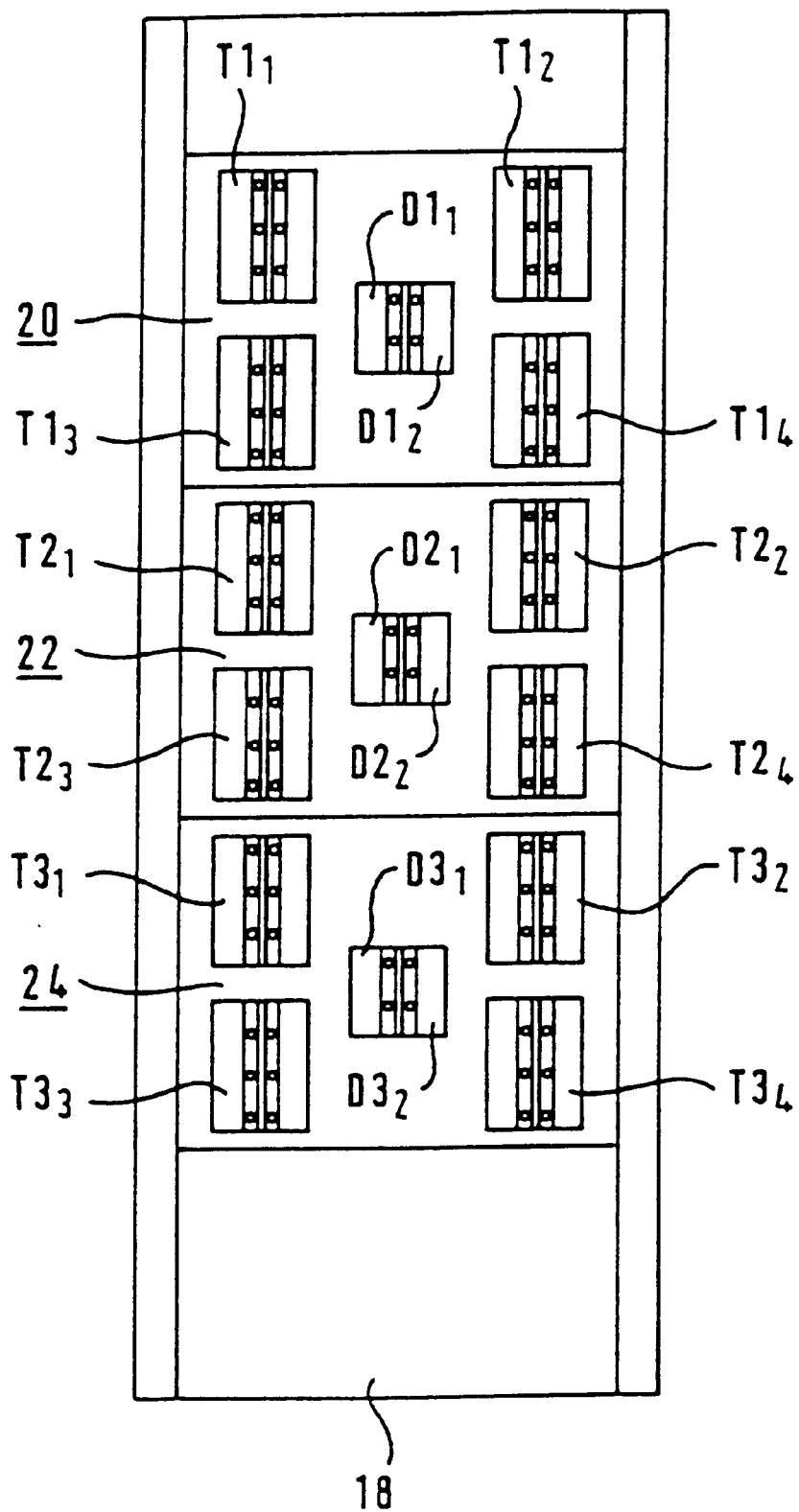
FIGS. 4–6 shows the stepwise implementation of the converter according to the present invention.
Figure 7:
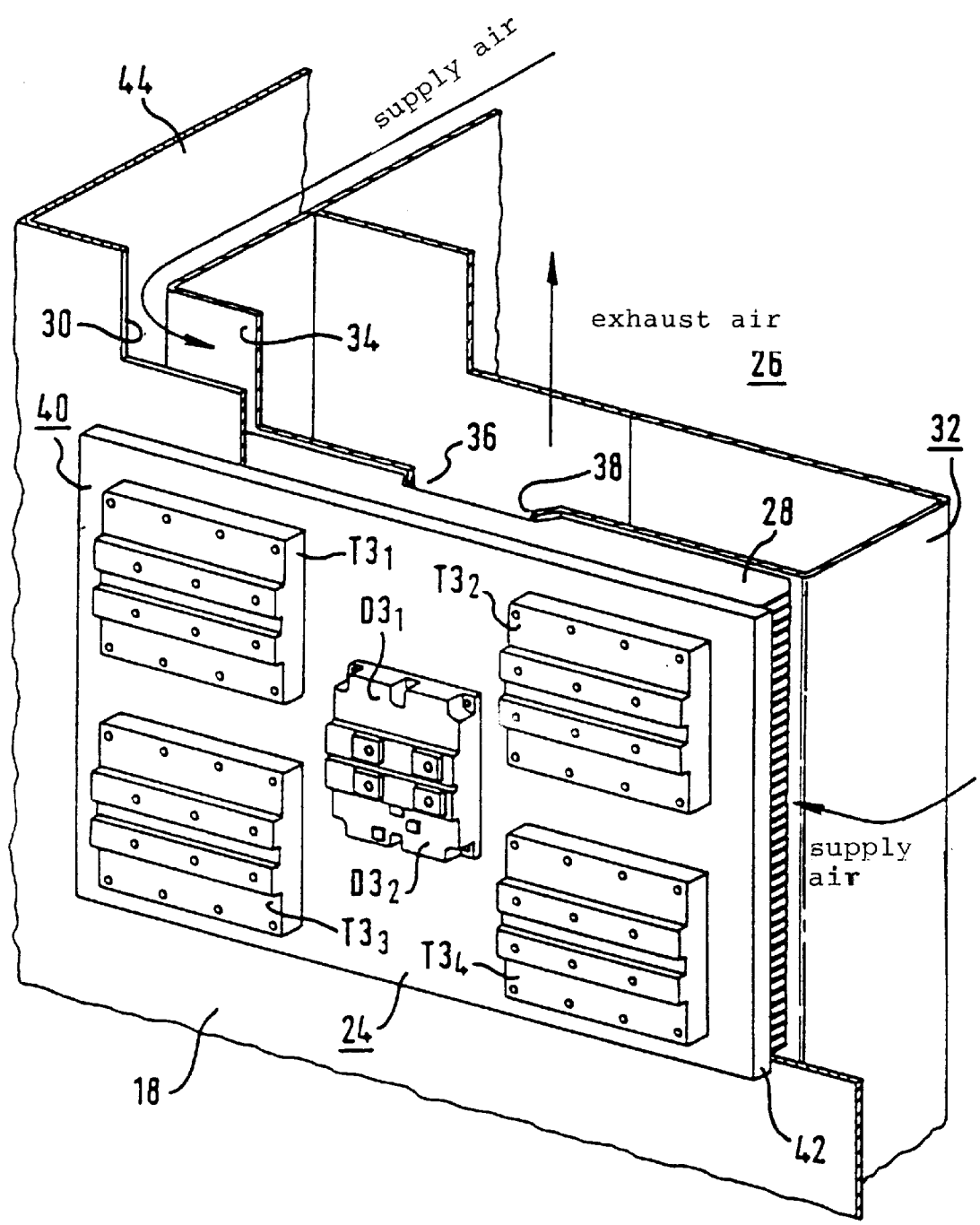
FIG. 7 shows a cut-away portion of the self-commutated power converter according to the present invention in accordance with FIG. 4.

FIG. 4 shows the front view of a partition 18 of self-commutated power converter 2 with only one three-point converter arm 12 per phase R, S, and T, according to the equivalent circuit diagram in accordance with FIG. 3. This partition 18, which has three phase heat sinks 20, 22, and 24, is used to partition a rearward ventilation space 26 from the front electronics space. Phase heat sinks 20, 22, and 24 are each detachably joined to partition 18. Cooling fins 28 (not shown in this representation) of these phase heat sinks 20, 22, and 24 each protrude through an opening 30 of partition 18 into rearward ventilation space 26 (FIG. 7). The three phase heat sinks 20, 22, and 24 are arranged one over another. High-power power modules $T1_1 \ldots T1_4, T2_1 \ldots T2_4$, and $T3_1 \ldots T3_4$, are joined phasewise to a phase heat sink 20, 22, and 24, respectively, in a detachable manner. Detachably joined to these phase heat sinks 20, 22, and 24 are also midpoint diodes $D1_1, D1_2, D2_1, D2_2,$ and $D3_1, D3_2$, these diodes being arranged in each case centrically between high-power modules $T1_1 \ldots T1_4, T2_1 \ldots T2_4,$ and $T3_1 \ldots T3_4$.

Figure 5:
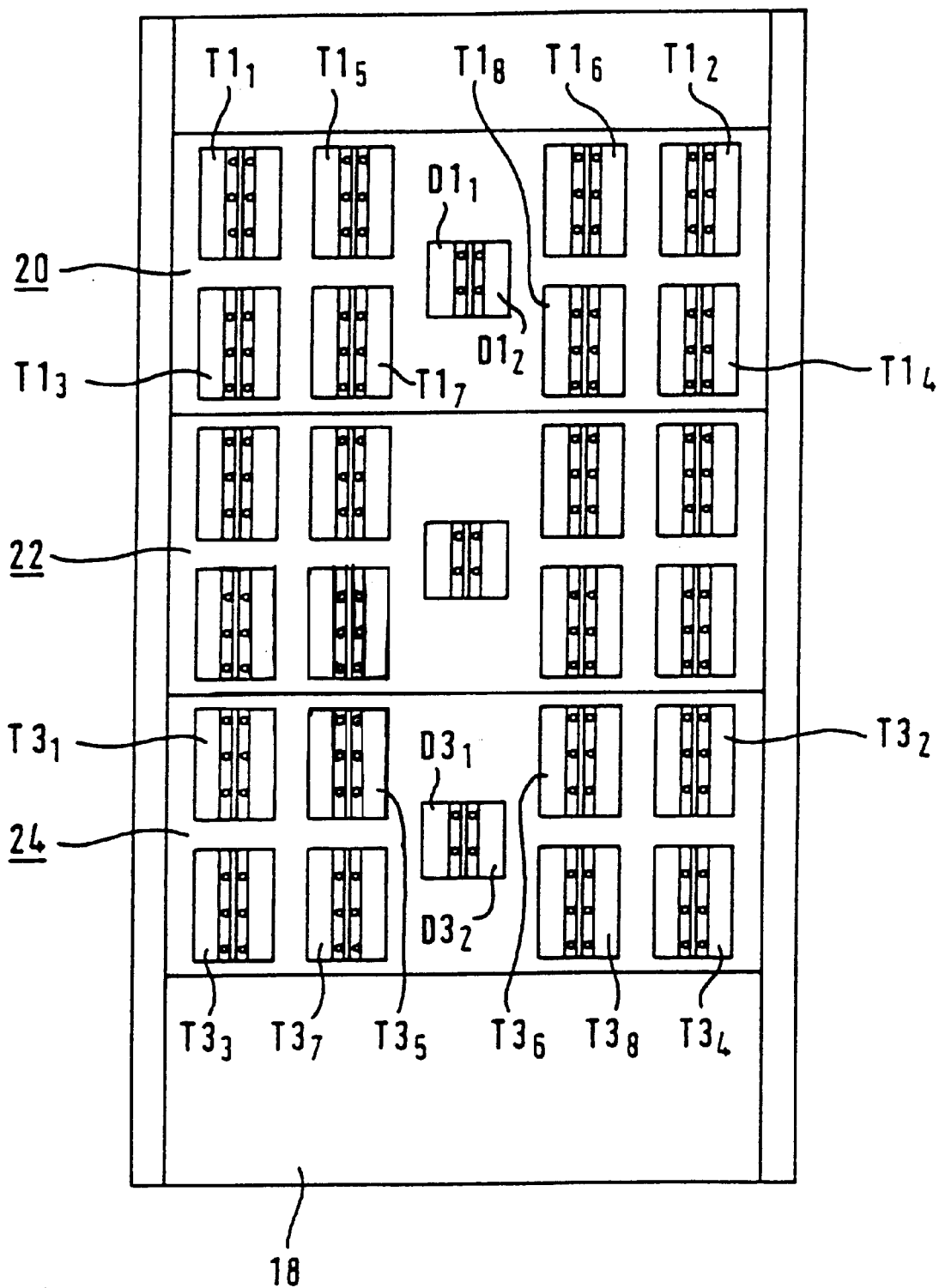

FIG. 5 shows the front view of partition 18 of self-commutated power converter 2 with two three-point converter arms 12 and 14 per phase R, S, and T, according to the equivalent circuit diagram in accordance with FIG. 3. This specific embodiment differs from the specific embodiment according to FIG. 4 in that each phase heat sink 20, 22, and 24 has four further high-power modules $T1_5 \ldots T1_8, T2_5 \ldots T2_8,$ and $T3_5 \ldots T3_8$. The placement of these individual high-power modules $T1_1 \ldots T1_8, T2_1 \ldots T2^8$, and $T3_1 \ldots T3_8$ depends primarily on the design of the low-inductive busbar system having the two link busbars and a midpoint busbar. By the increase in the number of modules, only the width of phase heat sinks 20, 22, and 24 changes, respectively.

Figure 6:
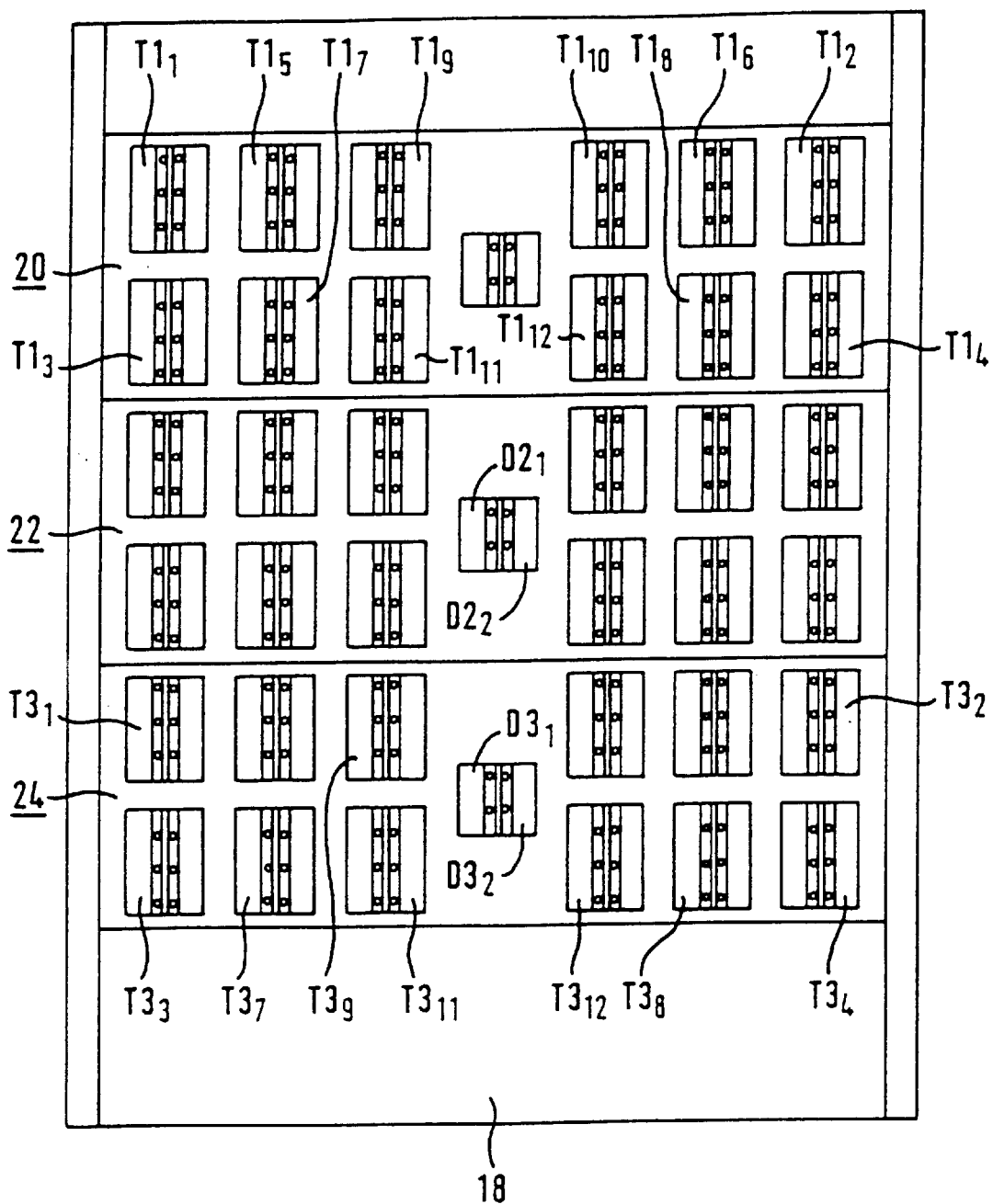

FIG. 6 shows the front view of partition 18 of self commutated power converter 2 with three three-point converter arms 12, 14 and 16 per phase R, S, and T, according to the equivalent circuit diagram in accordance with FIG. 3. This specific embodiment differs from the specific embodiment according to FIG. 5 in that each phase heat sink 20, 22, and 24 has four further high-power modules $T1_9 \ldots T1_{12}$, $T2_9 \ldots T2_{12}$, and $T3_9 \ldots T3_{12}$, as well. By this further increase in the number of modules, only the width of each phase heat sink 20, 22, and 24 changes.

FIG. 7 shows a cut-away portion of self-commutated power converter 2 according to FIG. 4. In this representation, the air-discharge duct 32 arranged in ventilation space 26 is visible. This air-discharge duct 32 has a cuboidal design, its large face 34, which faces cooling fins 28 of phase heat sinks 20, 22, and 24, having a centrical opening 36. Longitudinal edges 38 of this centrical opening 36 are each folded up. Cooling fins 28 of phase heat sinks 20, 22, and 24, are each raised in the region of high-power modules $T1_1 \ldots T1_4, T2_1 \ldots T2_4,$ and $T3_1 \ldots T3_4$. The end faces of raised cooling fins 28 facing folded up long sides 38 are covered by the folded up portions of longitudinal edges 38 of opening 36 of air-discharge duct 32. Because of this, the cooling air entering between cooling fins 28 on both sides of phase heat sinks 20, 22, or 24, respectively, can only exit through opening 36 of large face 34 of air-discharge duct 32. Midpoint diodes $D1_1, D1_2, D2_1, D2_2,$ and $D3_1, D3_2$ of each phase R, S, and T, are mounted on heat sink 20, 22, and 24 in the region of this opening 36.

In this representation, compared to the representation according to FIG. 4, high-power modules $T3_1 \ldots T3_4$ are arranged on fin base 40 of heat sink 24 in a manner that they are rotated by 90°. By this rotated arrangement of high-power modules $T3_1 \ldots T3_4$, a phase heat sink 24 having a particularly compact design is obtained. If a plurality of three-point converter arms 12, 14, and 16 are used per phase R, S, and T, then high-power modules $T1_1 \ldots T1_{12}$, $T2_1 \ldots T2_{12}$, and $T3_1 \ldots T3_{12}$ are arranged as in FIGS. 5 and 6 to obtain a compact design of phase heat sinks 20, 22, or 24. To allow phase heat sinks 20, 22, or 24 to be easily joined to partition 18, each fin base 40 of phase heat sinks 20, 22, or 24 has a surrounding rim 42 via which phase heat sinks 20, 22, or 24 can support themselves against partition 18. Openings 30 of partition 18 are arranged relative to each other in such a manner that, in addition, phase heat sinks 22 and 20 can support themselves against phase heat sinks 24 and 22, respectively, with the assistance of their surrounding rims 42. To attain as high a degree of protection as possible, a sealing ring can be arranged between a surrounding rim 42 of a phase heat sink 20, 22 or 24, respectively, and partition 18.

By using air-discharge duct 32 in ventilation space 26, the cooling air is laterally sucked in from ventilation space 26 between the cooling fins and centrally blown out into air-discharge duct 32. In this manner, each phase heat sink 20, 22, and 24 receives fresh cooling air on both sides, respectively, so that the same cooling conditions prevail for each high-power module $T1_1 \ldots T1_4, T2_1 \ldots T2_4,$ and $T3_1 \ldots T3_4$.

In a example embodiment of self-commutated power converter 2, cooling-air guide ducts 44 and 46 are provided in ventilation space 26, of which only cooling-air guide duct 44 is shown in FIG. 7. These cooling-air guide ducts 44 and 46 are arranged on both sides of air-discharge duct 32, and connect rearward air-inlet openings of ventilation space 26 to the end faces of cooling fins 28 of phase heat sinks 20, 22, and 24, the end faces constituting air supplies. In this context, these cooling-air guide ducts 44 and 46 can be divided into three separate air-guide ducts by transverse barriers arranged one over another. By these cooling-air guide ducts 44 and 46, the flow velocity of the cooling air can be increased so that the flow rate is increased. If barriers are used in each cooling-air guide duct 44 and 46, then the cooling circuits of phase heat sinks 20, 22, and 24 are decoupled from each other with respect to the fresh air.

In the representation according to FIG. 7, the exhaust air is sucked off upward in air-discharge duct 32 by at least one fan. This exhaust air can also be sucked off downward. There is also the possibility of sucking the air off to the rear, a plurality of small fans being arranged at the back wall along the width of air-discharge duct 32. In order that the exhaust air can be sucked off from air-discharge duct 32, the air-discharge duct must be connected to the fans by a connecting duct.

By allocating the cooling fins of each phase heat sink 20, 22, and 24 to an air-discharge duct 32, nearly the same cooling conditions are ensured for every high-power module $T1_1 \ldots T1_{12}$, $T2_1 \ldots T2_{12}$, and $T3_1 \ldots T3_{12}$. Because of this, the capacity of used high-power modules $T1_1 \ldots T1_{12}$, $T2_1 \ldots T2_{12}$, and $T3_1 \ldots T3_{12}$ can be fully utilized. Thus, self-commutated power converter 2 is considerably improved in terms of its weight and size, as a result of which its efficiency is also improved, and the cost is reduced in comparison with a power converter of the same power but of conventional design.

What is claimed is:

1. A self-commutated power converter of a voltage-impressing converter, comprising:

phase heat sinks having cooling fins;

high-power modules detachably joined phase-wise to the phase heat sinks;

a partition, the phase heat sinks being joined, one over another, to the partition so that the cooling fins of the phase heat sinks protrude through openings of the partition into a ventilation space, each of the phase heat sinks extending in a horizontal direction; and an air discharge duct configured so that cooling air of the ventilation space flows laterally, on both sides of each of the phase heat sinks, between the cooling fins of each of the phase heat sinks into that air-discharge duct, the cooling air being sucked out of the air discharge duct by a fan.

2. The self-commutated power converter according to claim 1, wherein the high-power modules are IGBT high-power modules.

3. The self-commutated power converter according to claim 1, wherein the high-power modules are arranged side-by-side along cooling-air supplies of the phase heat sinks.

4. The self-commutated power converter according to claim 1, wherein the high-power modules are arranged side-by side along cooling air passages.

5. The self-commutated power converter according to claim 1, wherein the high-power modules are arranged side-by side along cooling-air supplies and cooling-air passages.

6. The self-commutated power converter according to claim 1, wherein the cooling fins of the phase heat sinks are each raised in a region of the high-power modules.

7. The self-commutated power converter according to claim 1, wherein a fin base of each of the phase heat sinks has a surrounding rim.

8. The self-commutated power converter according to claim 1, wherein the air-discharge duct has a cuboidal design, a large face of the air-discharge duct facing the cooling fins of the phase heat sinks having a centrical opening.

9. The self-commutated power converter according to claim 8, wherein longitudinal edges of the centrical opening of the large face of the air-discharge duct are folded up.

10. The self-commutated power converter according to claim 1, wherein the ventilation space has cooling-air ducts connecting air-inlet openings of the ventilation space to cooling air supplies of the phase heat sinks.

11. The self-commutated power converter according to claim 1, further comprising:

a sealing ring arranged between the partition and each of the phase heat sinks.

* * * * *